United States Patent [19]

Aizawa

[11] Patent Number: 5,013,926
[45] Date of Patent: May 7, 1991

[54] PHOTOCOUPLER APPARATUS CAPABLE OF SHORTENING SWITCHING TIME OF OUTPUT CONTACT

[75] Inventor: Yoshiaki Aizawa, Machida, Japan

[73] Assignee: Kabushiki Kaisha Toshiba, Kawasaki, Japan

[21] Appl. No.: 523,877

[22] Filed: May 16, 1990

[30] Foreign Application Priority Data

May 17, 1989 [JP] Japan .................................. 1-123611

[51] Int. Cl.$^5$ .............................................. G02B 27/00
[52] U.S. Cl. ........................................ 250/551; 307/311
[58] Field of Search ..................... 250/551; 307/311; 455/602

[56] References Cited

U.S. PATENT DOCUMENTS

| | | | |
|---|---|---|---|
| 4,227,098 | 10/1980 | Brown et al. ........................ | 307/311 |
| 4,390,790 | 6/1983 | Rodriguez ............................ | 250/551 |
| 4,655,316 | 5/1987 | Hodges ................................ | 250/551 |
| 4,931,656 | 6/1990 | Ehalt et al. .......................... | 250/551 |
| 4,939,375 | 7/1990 | Walters et al. ...................... | 250/551 |

*Primary Examiner*—David C. Nelms
*Assistant Examiner*—Khaled Shami

*Attorney, Agent, or Firm*—Finnegan, Henderson, Farabow, Garrett and Dunner

[57] ABSTRACT

A photocoupler apparatus comprises an output MOSFET, a series circuit of a first photoelectromotive force diode array and a diode and connected to the gate and substrate of the MOSFET, a series circuit of a second photoelectromotive force diode array and a resistor and connected between both ends of the diode, and a normally-ON drive transistor. The diode is connected in a forward bias direction to the direction of a light current generated by the first diode array. When a charge current to be supplied to the MOSFET is large, most of the light current flows through the forward-biased diode to the output MOSFET and is not influenced by the current limitation by the resistor. When the charge current decreases, the diode is reverse-biased and the gate-substrate voltage of the MOSFET is higher than a voltage generated across the first diode array. The transistor is driven by a voltage produced across the resistor and is kept at a state between ON and OFF, thus preventing charges accumulated between the gate and substrate of the MOSFET from being discharged. When then first and second diode arrays stop generating photoelectromotive force, the charges accumulated between the gate and substrate of the MOSFET are discharged through the resistor.

16 Claims, 4 Drawing Sheets

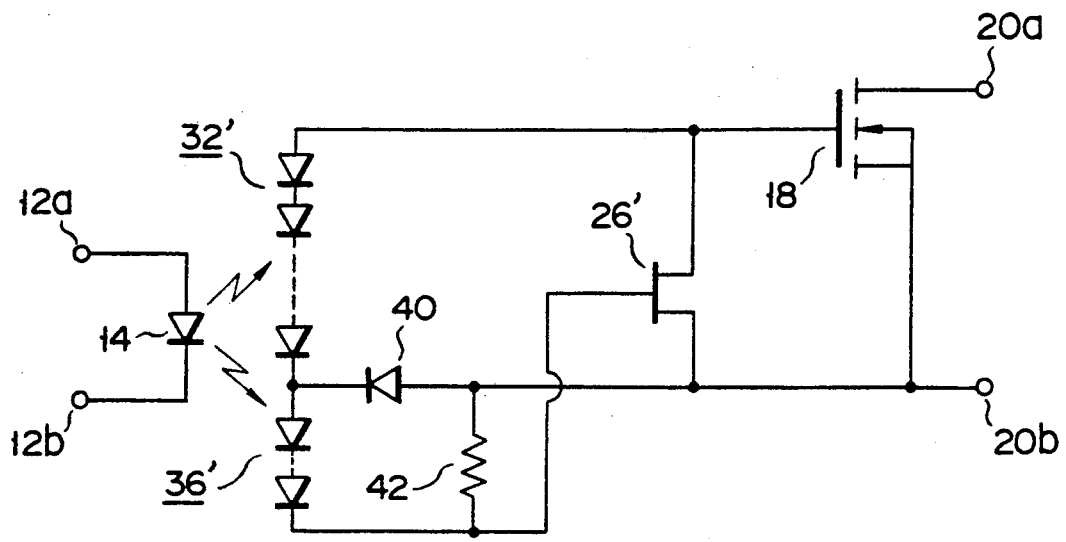
F I G. 7
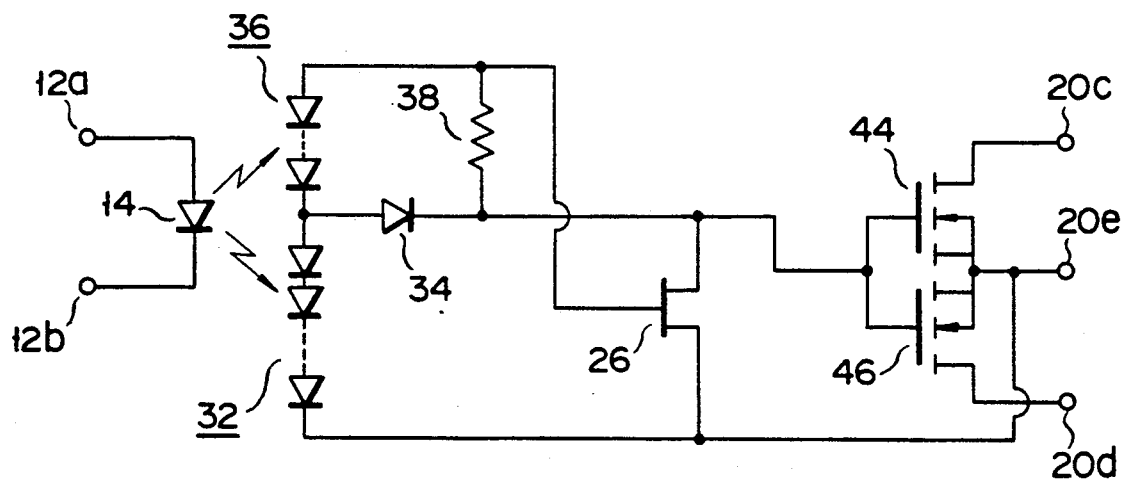
F I G. 8

PHOTOCOUPLER APPARATUS CAPABLE OF SHORTENING SWITCHING TIME OF OUTPUT CONTACT

BACKGROUND OF THE INVENTION

1. Field of the Invention

The present invention generally relates to a photocoupler apparatus, and more particularly, to a photocoupler apparatus which can shorten the switching time of output contacts.

2. Description of the Related Art

There are photocoupler apparatuses which converts an optical signal from a light-emitting diode driven by an input signal into an electric signal by a photoelectromotive force diode array photocoupled to the light-emitting diode, and drives a metal oxide semiconductor field effect transistor (hereinafter referred to as MOSFET) by this electric signal so as to acquire a contact signal. The conventional photocoupler apparatuses may be constituted as follows.

FIG. 1 illustrates a photocoupler as disclosed in U.S. Pat. No. 4,227,098. A light-emitting diode 14, connected to input terminals 12a and 12b, is photocoupled to a photodiode array 16 serving as a photoelectromotive force diode array. The photodiode array 16 has one end connected to the gate of a gate insulating type output MOSFET 18, and the other end connected to the substrate and source of the MOSFET 18. Output terminals 20a and 20b are respectively connected to the drain of the MOSFET 18 and the substrate and source thereof. Further, a resistor 22 having a resistive impedance is connected in parallel to the photodiode array 16.

When the thus constituted photocoupler is turned on, electric charges are accumulated in an electrostatic capacitor between the gate and substrate of the output MOSFET 18 by the photodiode array 16. When the photocoupler is turned off, the resistor 22 serves to discharge the accumulated charges. Without this resistor 22, the charges which have been accumulated in the electrostatic capacitor between the gate and substrate of the output MOSFET 18 would be discharged through the photodiode array 16. Such discharging would drastically slow down the discharging speed and significantly increase the time $T_{off}$ from a point when the input current flowing through the light-emitting diode 14 is cut off to a point when the output MOSFET 18 returns to an OFF status.

When a current is permitted to flow through the light-emitting diode 14 to render the output MOSFET 18 to an ON status, the presence of the resistor (resistive impedance) 22 is not preferable to permit bypassing of the current generated by the photodiode array 16. The value of the resistor 22 should be increased in order to shorten the time $T_{on}$ from a point where an input current is permitted to flow to the light-emitting diode 14 from the input terminals 12a and 12b until the output MOSFET 18 is rendered ON, as well as to reduce the minimum input current or operating current $I_{FT}$ required to render the output MOSFET 18 ON.

In order to shorten the aforementioned time $T_{off}$, however, the value of the resistor 22 needs to be set small, thus presenting a trade-off between $T_{on}$ ($I_{FT}$) and $T_{off}$ of the output MOSFET 18. The trade-off therefore prevents improvement of the characteristics of both $T_{on}$ and $T_{off}$ while shortening the switching time of the contacts of the output MOSFET 18 or realizing a high-speed operation.

A photocoupler shown in FIG. 2 and disclosed in U.S. Pat. No. 4,390,790, Published Unexamined Japanese Patent Application 57-107633 and EP 0048146, is designed to shorten the contact switching time of the output MOSFET 18.

A light-emitting diode 14, connected to input terminals 12a and 12b, is photocoupled to a first photodiode array 24. The photodiode array 24 has one end connected to the gate of a gate insulating type output MOSFET 18, and the other end connected to the substrate and source of the MOSFET 18. Output terminals 20a and 20b are respectively connected to the drain of the output MOSFET 18 and the substrate and source thereof. Both ends of the photodiode array 24 are further connected to the drain and source of a normally-ON drive transistor (FET) 26, respectively. Further, a second photodiode array 28, which has the illustrated polarity and is photocoupled to the light-emitting diode 14, is connected between the gate and source of the drive transistor 26.

According to the thus constituted photocoupler, a capacitance between the gate and substrate of the drive transistor 26 is smaller than that between the gate and substrate of the output MOSFET 18. It means that the necessary light current for the second photodiode array 28 can be smaller than that for the first photodiode array 24. This can reduce the area of each diode in the second photodiode array 28 and can thus enlarge the diode-occupying area in the first photodiode array 24, thus contributing to optimization of the efficient use of the space.

However, the second photodiode array 28 is required only to drive the drive transistor 26 and inevitably increases the number of the necessary photodiode arrays, which results in an increase in the cost of the photocoupler.

A photocoupler as disclosed in Published Unexamined Japanese Patent Application 63-99616 has been developed as a solution to overcome the above shortcoming. As shown in FIG. 3, a light-emitting diode 14, connected to input terminals 12a and 12b, is photocoupled to a photodiode array 16. The photodiode array 16 has one end connected to the gate of a gate insulating type output MOSFET 18, and the other end connected to the substrate and source of the MOSFET 18 through a resistor 30 having a resistive impedance. Output terminals 20a and 20b are respectively connected to the drain of the output MOSFET 18 and the substrate and source thereof. A normally-ON drive transistor (FET) 26 has its drain connected to the gate of the output MOSFET 18 and its source connected between the substrate and source thereof, with its gate connected between the photodiode array 16 and the resistor 30.

According to this photocoupler, the aforementioned problem is overcome by driving the drive transistor 26 with the potential difference across the resistor 30 (resistive impedance), which occurs by a current flowing across the resistor 30. In other words, in this circuit, a voltage applied between the gate and substrate of the output MOSFET 18 is the minimum voltage produced across the resistor to drive the drive transistor 26, subtracted from the voltage across the photodiode array 16. This circuit shown in FIG. 3 differs in the following points from the one shown in FIG. 2 which employs the second photodiode array only to drive transistor 26.

If the total number of the diodes in the photodiode array of the prior art circuit shown in FIG. 3 equals the total number of the diodes in the photodiode arrays in the prior art circuit shown in FIG. 2 (i.e., the sum of the diodes in the first photodiode array 24 and those of the second photodiode array 28), the former circuit (FIG. 3) has a higher voltage applied between the gate and substrate of the output MOSFET 18. It is therefore possible to drive a MOSFET having a high threshold voltage $V_{th}$, the gate-substrate voltage necessary to drive the drive transistor 26. In addition, as mentioned earlier, the gate-substrate capacitance of the drive transistor 26 is smaller than that of the output MOSFET 18.

According to the thus constituted photocoupler, however, a single photodiode array replenishes the gate-substrate capacitance of each of the drive transistor 26 and the output MOSFET 18, so that every diode constituting the photodiode array 16 should supply a large light current. In other words, since there are no separate photodiode arrays for respectively driving the output MOSFET 18 and the drive transistor 26, the photodiode array for driving the drive transistor 26 cannot be made smaller. This necessitates that the area of the photodiode array 16 be increased, thus increasing the overall space for the circuit.

In addition, as the resistor (resistive impedance) 30 is used as an impedance element, the resistive impedance limits the charge current to be supplied between the gate and substrate of the output MOSFET 18 when this current is large. This also limits shortening of the aforementioned time $T_{on}$.

To prevent such undesirable limitation, the resistor 30 in FIG. 3 may be replaced with a parallel circuit of a resistor and a diode array which does not include photodiodes. In this case, a large current involved to switching on or off a transistor may flow using the diode array as bypassing means. Driving the drive transistor 26 however requires a voltage obtained from a voltage drop for at least three to six diodes. This needs an area for the diode array serving as the bypassing means and further deteriorates the effective use of the total circuit space and the circuit characteristic, thus resulting in an increase in the cost of the circuit.

SUMMARY OF THE INVENTION

Accordingly, it is an object of the present invention to provide a photocoupler apparatus which has an improved ON/OFF characteristic of an output MOSFET and can shorten the switching time of an output contact without increasing the manufacturing cost.

According to one aspect of the present invention, there is provided a photocoupler apparatus comprising:
 a light-emitting element for emitting light by an input signal
 a first photoelectromotive force diode array for generating photoelectromotive force upon reception of an optical signal from the light-emitting element;
 a rectifying element having one end connected in series to one end of the first photoelectromotive force diode array;
 an output MOSFET having a gate connected to the other end of the rectifying element and a substrate connected to the other end of the first photoelectromotive force diode array;
 a series circuit connected between both ends of the rectifying element and including a second photoelectromotive force diode array for generating photoelectromotive force upon reception of an optical signal from the light-emitting element and an impedance element; and
 a normally-ON drive transistor having a control electrode connected to a junction between the second photoelectromotive force diode array and the impedance element, and having an energizing electrode having one end and the other end connected to the gate and substrate of the output MOSFET.

According to another aspect of the present invention, there is provided a photocoupler apparatus comprising:
 a light-emitting element for emitting light by an input signal;
 a first photoelectromotive force diode array for generating photoelectromotive force upon reception of an optical signal from the light-emitting element;
 a rectifying element having one end connected in series to one end of the first photoelectromotive force diode array;
 an output MOSFET having a gate connected to the other end of the first photoelectromotive force diode array and a substrate connected to the other end of the rectifying element;
 a series circuit connected between both ends of the rectifying element and including a second photoelectromotive force diode array for generating photoelectromotive force upon reception of an optical signal from the light-emitting element and an impedance element; and
 a normally-ON drive transistor having a control electrode connected to a junction between the second photoelectromotive force diode array and the impedance element, and having an energizing electrode having one end and the other end connected to the gate and substrate of the output MOSFET.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram of the second embodiment of this invention; and

FIG. 8 is a circuit diagram of the third embodiment of this invention.

DETAILED DESCRIPTION OF THE PREFERRED EMBODIMENTS

Figure 1:
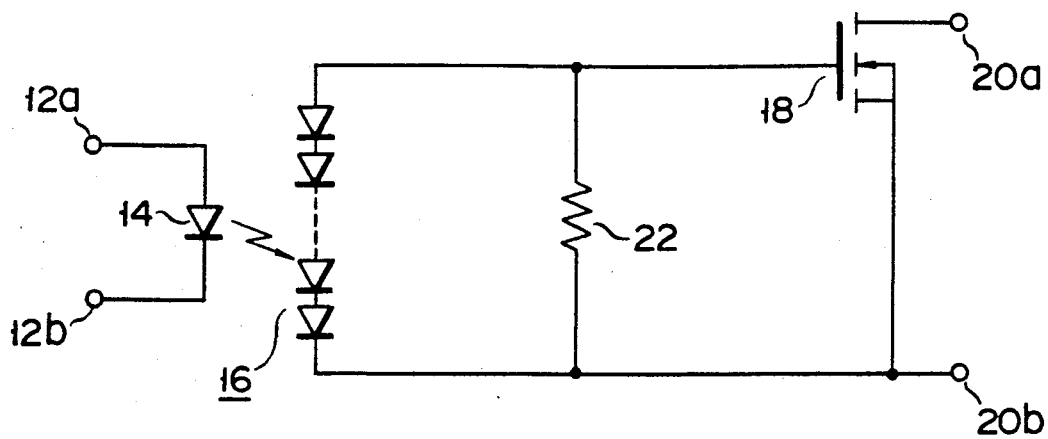
FIG. 1 is a circuit diagram illustrating the structure of a prior art photocoupler apparatus.
Figure 2:
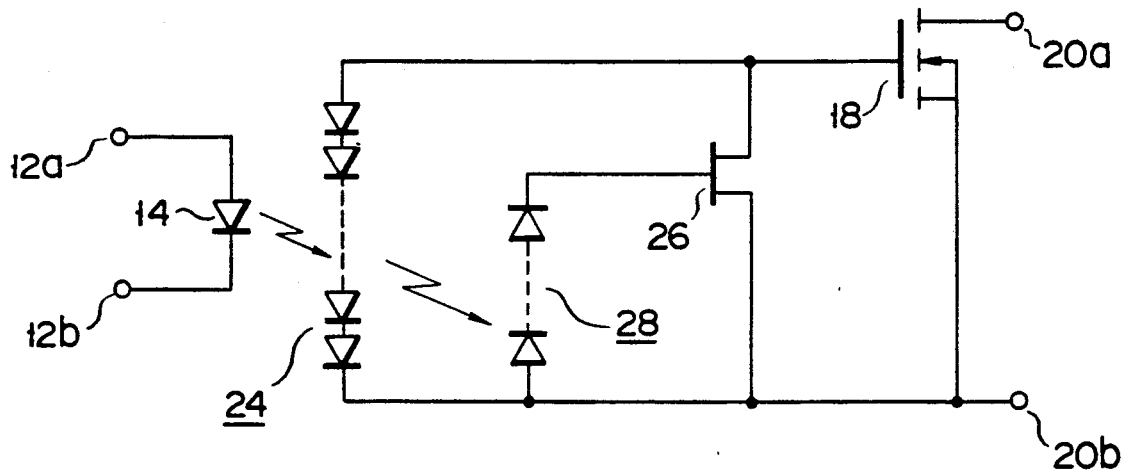
FIG. 2 is a circuit diagram illustrating another structure of a prior art photocoupler apparatus.
Figure 3:
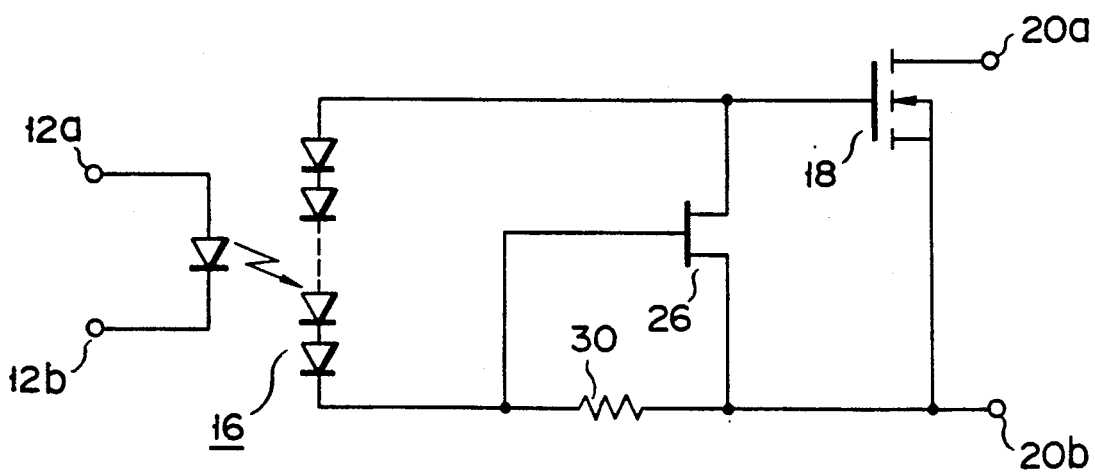
FIG. 3 is a circuit diagram illustrating a still different structure of a prior art photocoupler apparatus.

Preferred embodiments of the present invention will now be described referring to the accompanying drawings. It should be noted that the same reference numerals as used for the elements of the prior art are used to denote the identical or corresponding elements in the embodiments of this invention, omitting their otherwise redundant description.

Figure 4:
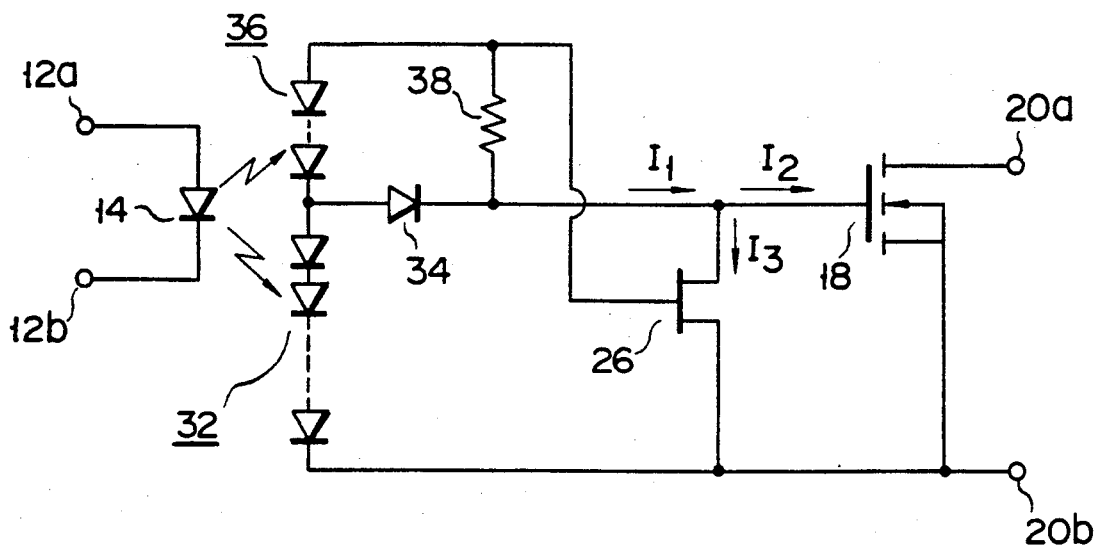
FIG. 4 is a circuit diagram of the first embodiment of a photocoupler apparatus according to the present invention.

FIG. 4 illustrates the circuit structure of a photocoupler apparatus according to one embodiment of the invention. A light-emitting diode 14 serving as a light-emitting circuit is connected between input terminals 12a and 12b. On a light-receiving circuit side, a photodiode array 32 serving as a first photoelectromotive force diode array has one end connected to the gate of a gate insulating type output MOSFET 18 through a diode 34 having the illustrated polarity, and the other end connected to the substrate and source of the output MOSFET 18, so that the photodiode array 32 is photocoupled to the light-emitting diode 14. The diode 34 is a diode normally used for a rectifying purpose, not a photodiode. The output MOSFET 18 has its drain connected to an output terminal 20a, with its substrate and source being connected to another output terminal 20b.

A normally-ON drive transistor (FET) 26 has its source and drain connected between the gate and the substrate and source of the output MOSFET 18 (hereinafter referred to as between the gate and source). The gate of this drive transistor 26 is connected through a photodiode array 36 as a second photoelectromotive force diode array to the aforementioned one end of the first photodiode array 32 to be photocoupled to the light-emitting diode 14. In other words, the first photodiode array 32 is connected in series to the second photodiode array 36. A resistor 38 serving as an impedance element is connected between the gate and source of the drive transistor 26.

The connection of the diode 34 is made such that the diode is in a forward bias direction to the direction of a light current generated by the first photodiode array 32, and is in a reverse bias direction to the direction of a light current generated by the second photodiode array 36. If a charge current supplied between the gate and source of the output MOSFET 18 is large, therefore, the diode 34 is in a forward bias status. Accordingly, most of the light current generated by the first photodiode array 32 flows through the diode 34 into a capacitor between the gate and source of the output MOSFET 18, and is not restricted by the second photodiode array 36 and the resistor 38.

When charging between the gate and source of the output MOSFET 18 progresses and the charge current decreases, the diode 34 is rendered in a reverse bias status and the first and second photodiode arrays 32 and 36 function as a single series-connected photodiode array, thus increasing the voltage applied between the gate and source of the output MOSFET 18.

Figure 5:
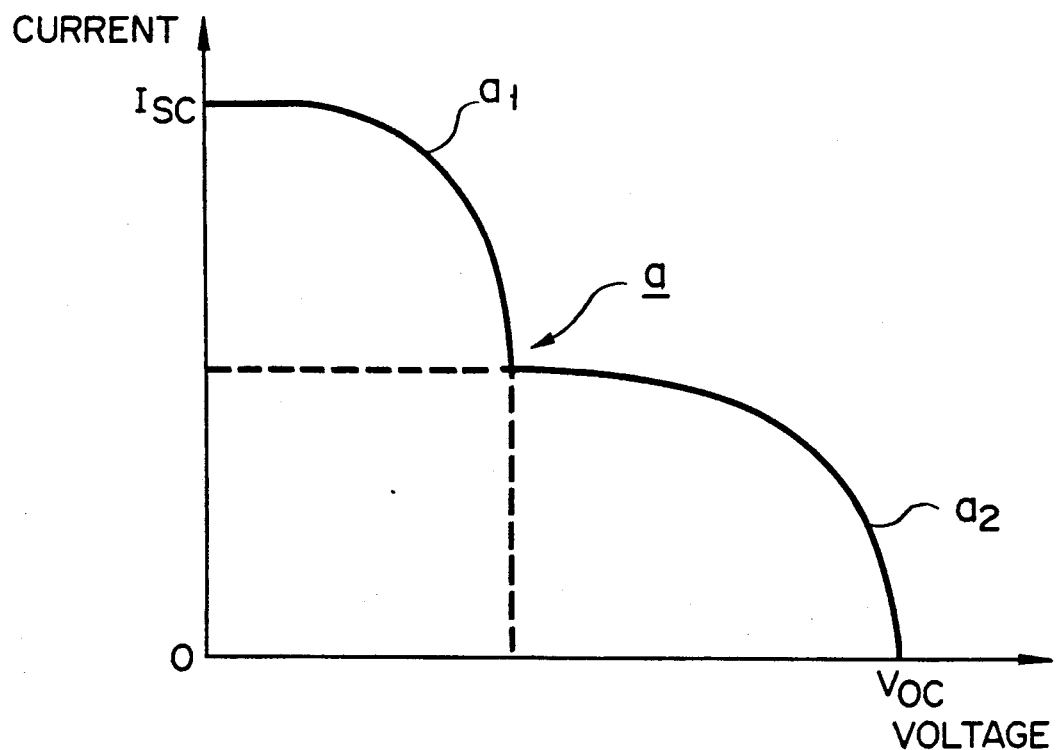
FIG. 5 is a current-voltage characteristic chart showing the relation between a current and voltage applied between the gate and source of an output MOSFET shown in FIG. 4.

FIG. 5 is a graph representing the current-voltage characteristic of the first photoelectromotive force diode to which a large short-circuit light current ISC (see curve a1). The graph also shows the current-voltage characteristic of a unit consisting of the second photoelectromotive force diode with a high voltage applied to its open end, and the second photoelectromotive force diode connected in series with the first photoelectromotive force diode (see curve a2). The relationship between the input current of the output MOSFET and the voltage applied between the gate and source of the MOSFET is represented by the combination a of the solid-line portions of the curve a1 and a2. A large charge current can therefore flow at the beginning of the charging of the capacitor between the gate and source of the output MOSFET 18. Further, since a high voltage can be applied between the gate and source as the charging progresses, the output MOSFET having a high threshold voltage ($V_{th}$) can be turned on at a high speed.

Figure 6:
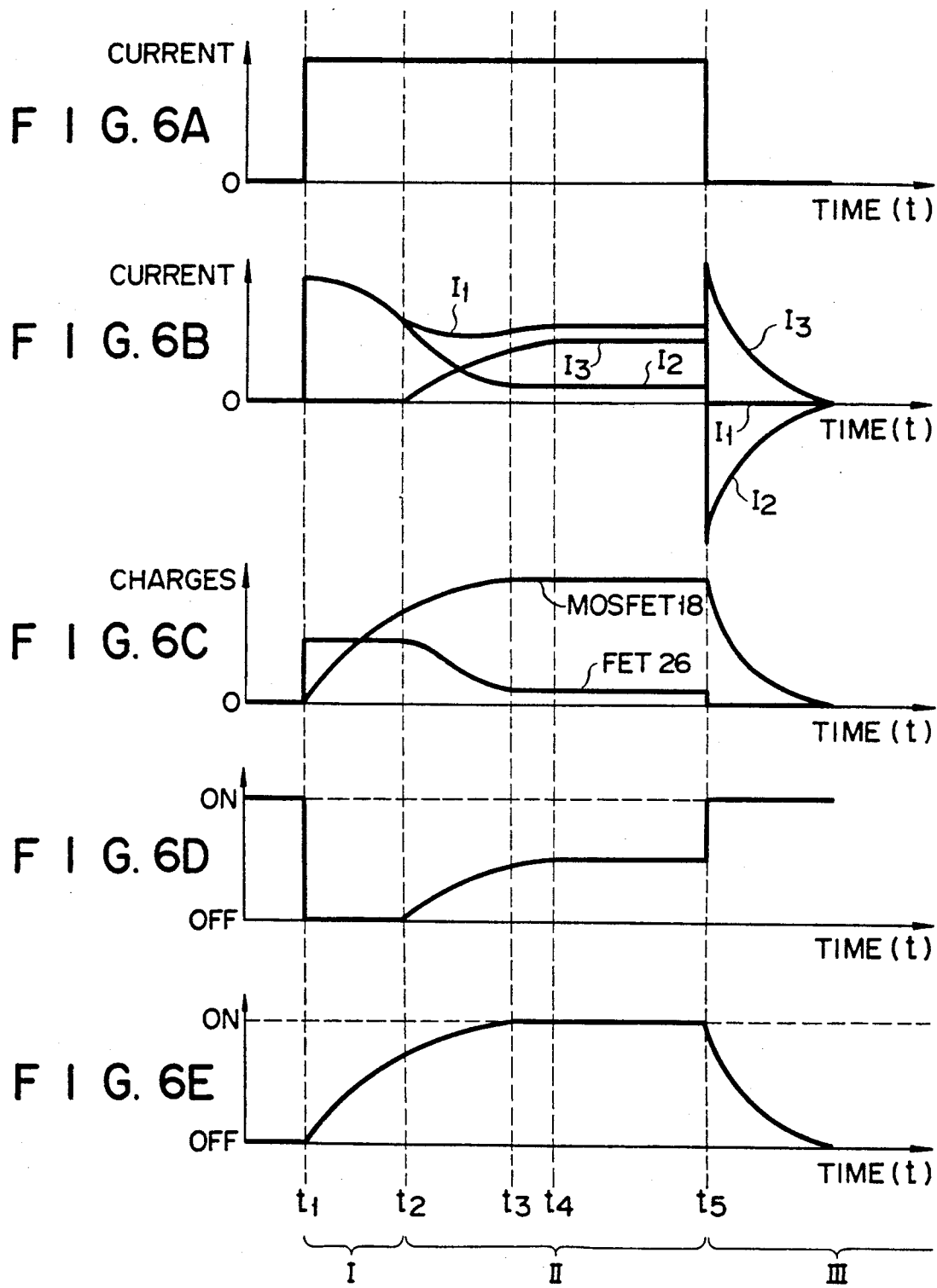
FIGS. 6A through 6E are timing charts for explaining the operation of the first embodiment.

The operation of the first embodiment will now be described referring to the timing charts given in FIGS. 6A through 6E. FIG. 6A presents a timing chart illustrating a change in the current of the light-emitting diode 14 with time, FIG. 6B a timing chart illustrating a change in currents $I_1$, $I_2$ and $I_3$ shown in FIG. 4 with time, FIG. 6C a timing chart illustrating a change in charges accumulated between the gate and source of the output MOSFET 18, and a change in charges accumulated between the gate and source of the drive transistor 26, with time, FIG. 6D a timing chart illustrating a change in switching status of the drive transistor 26 with time, and FIG. 6E a timing chart illustrating a change in switching status of the output MOSFET 18 with time.

When a current is supplied between the input terminals 12a and 12b from an input circuit (not shown) at time $t_1$, the light-emitting diode 14 emits light (see FIG. 6A). The light from the light-emitting diode 14 enters the first and second photodiode arrays 32 and 36, which are photocoupled to the light-emitting diode 14, and causes the photodiode arrays to generate photoelectromotive force.

At this time, the current $I_1$ supplied from both ends of the serially connected first and second photodiode arrays 32 and 36 at first becomes the charge current $I_2$ flowing through the resistor 38 into the capacitor between the gate and source of the output MOSFET 18 and the current $I_3$ flowing between the source and drain of the normally-ON drive transistor 26 that is in an ON state. Since the current $I_1$ is very large initially (time $t_1$) (see FIG. 6B), a large potential difference occurs across the resistor 38 and the gate and source of the drive transistor 26 are biased, thus turning the transistor 26 off as shown in FIG. 6D. In this state, the current $I_1$ supplied from the first and second photodiode arrays 32 and 36, i.e., $I_3$, becomes only the charge current to charge the capacitor between the gate and source of the output MOSFET 18.

At this time, the diode 34 is biased in the forward direction. At least part of the current supplied from the first photodiode array 32 therefore passes through the diode 34, without flowing through the second photodiode array 36 and the resistor 38. The larger the amount of the net current, the greater the ratio of the bypassed current, so that most of the charge current to charge the capacitor between the gate and source of the output MOSFET 18 does not flow through the resistor 38. This can ensure considerably efficient charging without any current restriction by the resistor 38. As result, the status between the drain and source of the output MOSFET 18 changes to an ON state, as shown in FIG. 6E.

Further, as charging of the capacitor between the gate and source of the output MOSFET 18 sufficiently progresses (time $t_2$) as shown in FIG. 6C, the current $I_1$ decreases, so does the potential difference across the resistor 38. Consequently, the bias voltage between the gate and source of the drive transistor 26 decreases. Since the diode 34 is biased in the reverse direction at this time, no current supplied from the first photodiode array 32 flows through the diode 34 at all. In other words, the entire current from the first photodiode array 32 flows through the second photodiode array 36 and resistor 38 (region I between times $t_1$ and $t_2$).

After time $t_2$, as the drive transistor 26 is rendered in an ON status, a current starts flowing between the source and drain of the drive transistor 26 and the current $I_1$ increases (time $t_3$). Since the entire current $I_1$ flows through the second photodiode array 36 and resistor 38 from the first photodiode array 32 during this period, the potential difference across the resistor 38 or the bias voltage between the gate and source of the drive transistor 26 does not fall below a given value. Therefore, the source-drain current $I_3$ of the drive transistor 26 is restricted. That is, an increase in the source-drain current $I_3$ of the drive transistor 26 (after time $t_2$) acts in the direction to set the source-drain state to an OFF state. The source-drain current $I_3$ therefore becomes self-limiting and the drive transistor 26 does not have a complete ON state between its source and drain (see FIG. 6D). As long as the first and second photodiode arrays 32 and 36 are generating photoelectromotive force by light from the light-emitting diode 14 (i.e., as long as a current is supplied between the input terminals 12a and 12b), the source-drain current of the drive transistor 26 is only the current supplied from the first and second photodiode arrays 32 and 36. Consequently, the charges accumulated between the drain and source of the output MOSFET 18 are not discharged and the ON status between the drain and source of the output MOSFET 18 is retained ($t_3$ to $t_4$ to $t_5$). The time duration between $t_2$ and $t_5$ is referred to as a region II.

When the current supply to the input terminals 12a and 12b is stopped at time $t_5$, the light-emitting diode 14 stops emitting light, causing the first and second photodiode arrays 32 and 36 to stop generating photoelectromotive force. As shown in FIG. 6B, therefore, the current $I_1$ disappears and the bias voltage between the gate and source of the drive transistor 26 becomes zero. As a result, the charges accumulated between the gate and source of the drive transistor 26 are discharged through the resistor 38 (see FIG. 6C). The drive transistor 26 is rendered to the complete ON state (see FIG. 6D).

When the status of the drive transistor 26 becomes the complete ON state, the gate and source of the output MOSFET 18 are rendered in a short-circuited state, so that the accumulated charges are promptly discharged. The drain-source status of the output MOSFET 18 is therefore rendered to be the OFF state (region III after time $t_5$) as shown in FIG. 6E.

According to the thus constituted photocoupler apparatus, with a large charge current for the capacitor between the gate and source of the output MOSFET 18, most of the light current generated by the first photodiode array 32 flows through the diode 34 into the capacitor between the gate and source of the output MOSFET 18, so that the second photodiode array 36 and the resistor 38 serving as an impedance element hardly influence the charge current between the gate and source of the output MOSFET 18.

After the voltage is increased by the second photodiode array 36, the remaining light current generated by the first photodiode array 32 partially flows into the gate of the drive transistor 26 to drive the transistor, and the remaining portion flows through the resistor 38 to be part of the charge current that is applied between the gate and source of the output MOSFET 18. As the second photodiode array 36 mainly serves to drive the drive transistor 26 which operates on a small current, a large current is not required.

When the charging between the gate and source of the output MOSFET 18 is nearly completed and the charge current becomes small, the diode 34 is reverse-biased and the first and second photodiode arrays 32 and 36 function as a single series-connected photodiode array, thus increasing the voltage applied between the gate and source of the output MOSFET 18. In this case, as the charge current is decreased, the single photodiode array has only to supply a small current.

The second photodiode array 36 does not therefore require a large current, so that its area can be made smaller and it can be connected in series to the first photodiode array 32 to increase the voltage to be applied between the gate and source of the output MOSFET 18. The structure of this embodiment can eliminate waste and can optimize the arrangement of the individual components, thus improving the efficient use of limited space and the characteristic of the apparatus.

FIG. 7 illustrates the second embodiment of the present invention. To avoid a redundant description, only those portions of the structure and operation which differ from those of the above-described prior art and first embodiment will be described below.

On the side of a light-receiving circuit, a photodiode array 32' serving as a first photoelectromotive force diode array has its one end connected to the gate of a gate insulating type output MOSFET 18 and the other end connected to the substrate and source of the output MOSFET 18 through a diode 40 having the illustrated polarity. The diode 40 is a diode normally used for a rectifying purpose, not a photodiode.

A normally-ON drive transistor (FET) 26', whose drain and source are connected between the gate and source of the output MOSFET 18, has its gate connected to the other end of the first photodiode array 32' through a photodiode array 36' serving as a second photoelectromotive force diode array. In other words, the first and second photodiode arrays 32' and 36' are connected in series. A resistor 42 as an impedance element is connected between the gate and source of the drive transistor 26'.

The drive transistor 26' of the second embodiment is driven by a negative gate bias, whereas the drive transistor 26 of the first embodiment is driven by a positive gate bias. Referring to FIG. 7 in contrast to FIG. 4, therefore, the second photodiode array 36' is connected to the negative side of the first photodiode array 32'. The diode 40 is also connected to the negative side of the photodiode array 32' accordingly. In other words, the second embodiment differs from the first embodiment only in these points. As the other circuit configuration, the operational principle and the operational statuses of the second embodiment are the same as those of the first embodiment, their description will be omitted here.

FIG. 8 illustrates the third embodiment of the present invention. The third embodiment differs from the first and second embodiments only in the circuit configuration, and has the same operational principle and operational statuses as the first and second embodiments. To avoid a redundant description, only those portions of the circuit structure which differ from those of the first and second embodiments will be described below.

The third embodiment employs two parallel-connected output MOSFETs 18 of the type used in the first embodiment and three output terminals. A photodiode array 32 serving as a first photoelectromotive force diode array has its one end connected to the gates of first and second gate insulating type output MOSFETs 44 and 46, and the other end connected to the substrates and sources of the first and second output MOSFETs 44 and 46 through a diode 34 having the illustrated polarity. The output MOSFETs 44 and 46 have their drains connected to output terminals 20c and 20d, respectively, with their substrates and sources being connected to another output terminal 20e.

The thus constituted photocoupler apparatus can eliminate waste and can optimize the arrangement of the individual components, thus improving the efficient use of limited space and the characteristic of the apparatus.

The present invention is not restricted to the above-described particular embodiments, but may be modified in various manners within the scope and spirit of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A photocoupler apparatus comprising:
   a light-emitting element for emitting light by an input signal;
   a first photoelectromotive force diode array for generating photoelectromotive force upon reception of an optical signal from said light-emitting element;
   a rectifying element having one end connected in series to one end of said first photoelectromotive force diode array;
   an output MOSFET having a gate connected to the other end of said rectifying element and a substrate connected to the other end of said first photoelectromotive force diode array;
   a series circuit connected between both ends of said rectifying element and including a second photoelectromotive force diode array for generating photoelectromotive force upon reception of an optical signal from said light-emitting element and an impedance element; and
   a normally-ON drive transistor having a control electrode connected to a junction between said second photoelectromotive force diode array and said impedance element, and having an energizing electrode having one end and the other end connected to said gate and substrate of said output MOSFET.

2. A photocoupler apparatus according to claim 1, wherein said rectifying element is connected in a forward bias direction to photoelectromotive force to be generated by said first photoelectromotive force diode array.

3. A photocoupler apparatus according to claim 2, wherein said substrate of said output MOSFET includes a source.

4. A photocoupler apparatus according to claim 3, wherein said normally-ON drive transistor is constituted by an electrostatic induction type transistor.

5. A photocoupler apparatus according to claim 3, wherein said normally-ON drive transistor is constituted by a depletion mode field effect transistor.

6. A photocoupler apparatus according to claim 3, wherein said impedance element includes a resistor.

7. A photocoupler apparatus according to claim 4, wherein said impedance element includes a resistor.

8. A photocoupler apparatus according to claim 5, wherein said impedance element includes a resistor.

9. A photocoupler apparatus comprising:
   a light-emitting element for emitting light by an input signal;
   a first photoelectromotive force diode array for generating photoelectromotive force upon reception of an optical signal from said light-emitting element;
   a rectifying element having one end connected in series to one end of said first photoelectromotive force diode array;
   an output MOSFET having a gate connected to the other end of said first photoelectromotive force diode array and a substrate connected to the other end of said rectifying element;
   a series circuit connected between both ends of said rectifying element and including a second photoelectromotive force diode array for generating photoelectromotive force upon reception of an optical signal from said light-emitting element and an impedance element; and
   a normally-ON drive transistor having a control electrode connected to a junction between said second photoelectromotive force diode array and said impedance element, and having an energizing electrode having one end and the other end connected to said gate and substrate of said output MOSFET.

10. A photocoupler apparatus according to claim 9, wherein said rectifying element is connected in a forward bias direction to photoelectromotive force to be generated by said first photoelectromotive force diode array.

11. A photocoupler apparatus according to claim 10, wherein said substrate of said output MOSFET includes a source.

12. A photocoupler apparatus according to claim 11, wherein said normally-ON drive transistor is constituted by an electrostatic induction type transistor.

13. A photocoupler apparatus according to claim 11, wherein said normally-ON drive transistor is constituted by a depletion mode field effect transistor.

14. A photocoupler apparatus according to claim 11, wherein said impedance element includes a resistor.

15. A photocoupler apparatus according to claim 12, wherein said impedance element includes a resistor.

16. A photocoupler apparatus according to claim 13, wherein said impedance element includes a resistor.

* * * * *